US012776791B2

(12) United States Patent
Yesilyurt et al.

(10) Patent No.: US 12,776,791 B2
(45) Date of Patent: Oct. 27, 2026

(54) TRANSMITTER IMPLEMENTED WITH AN INVERTER BUFFER

(71) Applicant: QUALCOMM Incorporated, San Diego, CA (US)

(72) Inventors: Ayse Yesilyurt, San Jose, CA (US); Shinwoong Park, Sunnyvale, CA (US); Mazhareddin Taghivand, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 307 days.

(21) Appl. No.: 18/418,484

(22) Filed: Jan. 22, 2024

(65) Prior Publication Data

US 2025/0240038 A1 Jul. 24, 2025

(51) Int. Cl.
*H04B 1/00* (2006.01)
*H03F 3/19* (2006.01)

(52) U.S. Cl.
CPC ............. *H04B 1/0053* (2013.01); *H03F 3/19* (2013.01); *H03F 2200/451* (2013.01)

(58) Field of Classification Search
CPC ........... H04B 1/00; H04B 1/0053; H03F 3/19; H03F 2200/451
See application file for complete search history.

(56) References Cited

U.S. PATENT DOCUMENTS 7,995,982 B2 * 8/2011 Kawabe ................... H04B 1/30 375/322
8,238,864 B2 * 8/2012 Kawabe ................... H04B 1/30 375/322
8,432,237 B2 * 4/2013 Klemens .................. H03H 7/38 333/132
8,446,976 B2 * 5/2013 Lee .......................... H03K 7/06 370/215
8,451,157 B2 * 5/2013 Vilhonen .............. H03M 1/802 375/297
8,493,126 B2 * 7/2013 Sankaranarayanan ........................ H03D 7/1441 327/356
8,514,015 B2 * 8/2013 Chen ........................ H03F 1/223 330/311
9,065,504 B2 * 6/2015 Kwon ........................ H03F 3/24
9,379,722 B2 * 6/2016 Chen ....................... H03K 3/017
9,520,906 B2 * 12/2016 Butterfield .......... H04L 27/3416
9,531,409 B2 * 12/2016 Butterfield ................ H03F 3/19
(Continued)

FOREIGN PATENT DOCUMENTS

WO 2015199916 A1 12/2015
WO 2021168273 A1 8/2021

OTHER PUBLICATIONS

International Search Report and Written Opinion—PCT/US2024/061650—ISA/EPO—Mar. 26, 2025.

*Primary Examiner* — Hai V Nguyen
(74) *Attorney, Agent, or Firm* — Gerald P. Joyce, III

(57) ABSTRACT

Certain aspects of the present disclosure are directed towards transmitters implemented with an inverter buffer and techniques for wireless transmission using such transmitters. An example transmitter generally includes: an upconverter circuit including one or more inputs coupled to one or more transmit chains of the transmitter, an inverter buffer including an input coupled to a first output of the upconverter circuit, and at least one amplifier coupled to a first output of the inverter buffer.

20 Claims, 6 Drawing Sheets

(56) References Cited

U.S. PATENT DOCUMENTS 9,595,919 B2 * 3/2017 Rajendran ............ H03D 7/1441
9,998,167 B2 * 6/2018 Nick ...................... H04B 1/006
10,608,601 B2 * 3/2020 Karmaker ........... H03F 3/45475
10,727,790 B2 * 7/2020 Balteanu ................. H03F 3/193
10,979,036 B1 * 4/2021 Reja ................. H03K 3/356078
10,985,793 B1 * 4/2021 Park .......................... H03F 3/68
11,431,358 B2 * 8/2022 Park ..................... H03D 7/1483
11,469,709 B2 * 10/2022 Agrawal ................ H03B 19/14
11,595,028 B2 * 2/2023 Moslehi Bajestan ..... H03L 7/16
11,616,517 B2 * 3/2023 Lyn .......................... H03D 7/14 375/295
12,081,184 B1 * 9/2024 Sahota ................ H03F 3/45479
12,294,396 B2 * 5/2025 Levitan ................. H03F 1/3247
12,306,656 B2 * 5/2025 Liang ........................ G05F 3/30
2009/0054007 A1 * 2/2009 Kawabe ................... H04B 1/30 455/76
2009/0080568 A1 * 3/2009 Lee .......................... H03K 7/06 375/306
2010/0120390 A1 * 5/2010 Panikkath .............. G01R 13/02 455/208
2010/0141337 A1 * 6/2010 Chen ....................... H03F 3/211 330/124 R
2010/0167667 A1 * 7/2010 Laporte ................... H01F 21/12 333/25
2011/0210881 A1 * 9/2011 Vilhonen .............. H03M 1/802 341/150
2011/0275340 A1 * 11/2011 Kawabe ................... H04B 1/30 455/313
2012/0013387 A1 * 1/2012 Sankaranarayanan ....................... H03D 7/165 327/355
2012/0087418 A1 * 4/2012 Zheng ................. H03F 3/45188 375/259
2014/0375363 A1 * 12/2014 Chen ...................... H03K 3/017 327/115
2015/0381215 A1 * 12/2015 Butterfield ................ H03F 1/02 375/295
2015/0381401 A1 * 12/2015 Butterfield ................ H03F 1/02 375/295
2017/0279445 A1 * 9/2017 Taghivand .............. H02M 3/07
2018/0351535 A1 * 12/2018 Karmaker ........... H03F 3/45475
2019/0334483 A1 * 10/2019 Balteanu ................... H03F 1/56
2019/0379329 A1 * 12/2019 Kwok ................... H03F 1/0205
2021/0058102 A1 * 2/2021 Park ..................... H03D 7/1483
2021/0105038 A1 * 4/2021 Park .......................... H04B 1/40
2021/0258023 A1 * 8/2021 Lyn ...................... H04B 1/0067
2021/0409007 A1 * 12/2021 Moslehi Bajestan ........................ H03K 5/00006
2022/0200532 A1 * 6/2022 Agrawal ................ H03B 19/14
2022/0352899 A1 * 11/2022 Saputra .................. H03K 19/21
2022/0416816 A1 * 12/2022 Nagarajan ................. G05F 3/16
2023/0049388 A1 * 2/2023 Zhai ........................ H03F 3/245
2023/0114964 A1 * 4/2023 Blin ........................ H02M 3/07 327/526
2023/0409068 A1 * 12/2023 Liang ......................... G05F 3/30
2024/0022271 A1 * 1/2024 Levitan ................. H03F 1/3247
2024/0322794 A1 * 9/2024 Sahota ................ H03F 3/45479
2025/0088149 A1 * 3/2025 Tsai ...................... H03F 1/0222

* cited by examiner

TRANSMITTER IMPLEMENTED WITH AN INVERTER BUFFER

TECHNICAL FIELD

Certain aspects of the present disclosure generally relate to electronic circuits and, more particularly, to a transmitter implemented with an inverter buffer.

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, Fifth Generation (5G) New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more transmitters and receivers.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include reduced power and area consumption and facilitating operation at higher frequencies.

Certain aspects of the present disclosure are directed towards a transmitter. The transmitter generally includes: an upconverter circuit including one or more inputs coupled to one or more transmit chains of the transmitter; an inverter buffer including an input coupled to a first output of the upconverter circuit; and at least one amplifier coupled to a first output of the inverter buffer.

Certain aspects of the present disclosure are directed towards a method for wireless communication. The method generally includes: generating an upconverted signal using an upconverter circuit of a transmitter; generating a buffered signal using an inverter buffer based on the upconverted signal; generating, via at least one amplifier of the transmitter, an amplified signal based on the buffered signal; and performing a signal transmission using the amplified signal.

Certain aspects of the present disclosure are directed towards a wireless device. The wireless device generally includes: an antenna and a transmitter coupled to the antenna and comprising: an upconverter circuit including one or more inputs coupled to one or more transmit chains of the transmitter; an inverter buffer including an input coupled to a first output of the upconverter circuit; and a first amplifier coupled to a first output of the inverter buffer and including an output coupled to the antenna.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
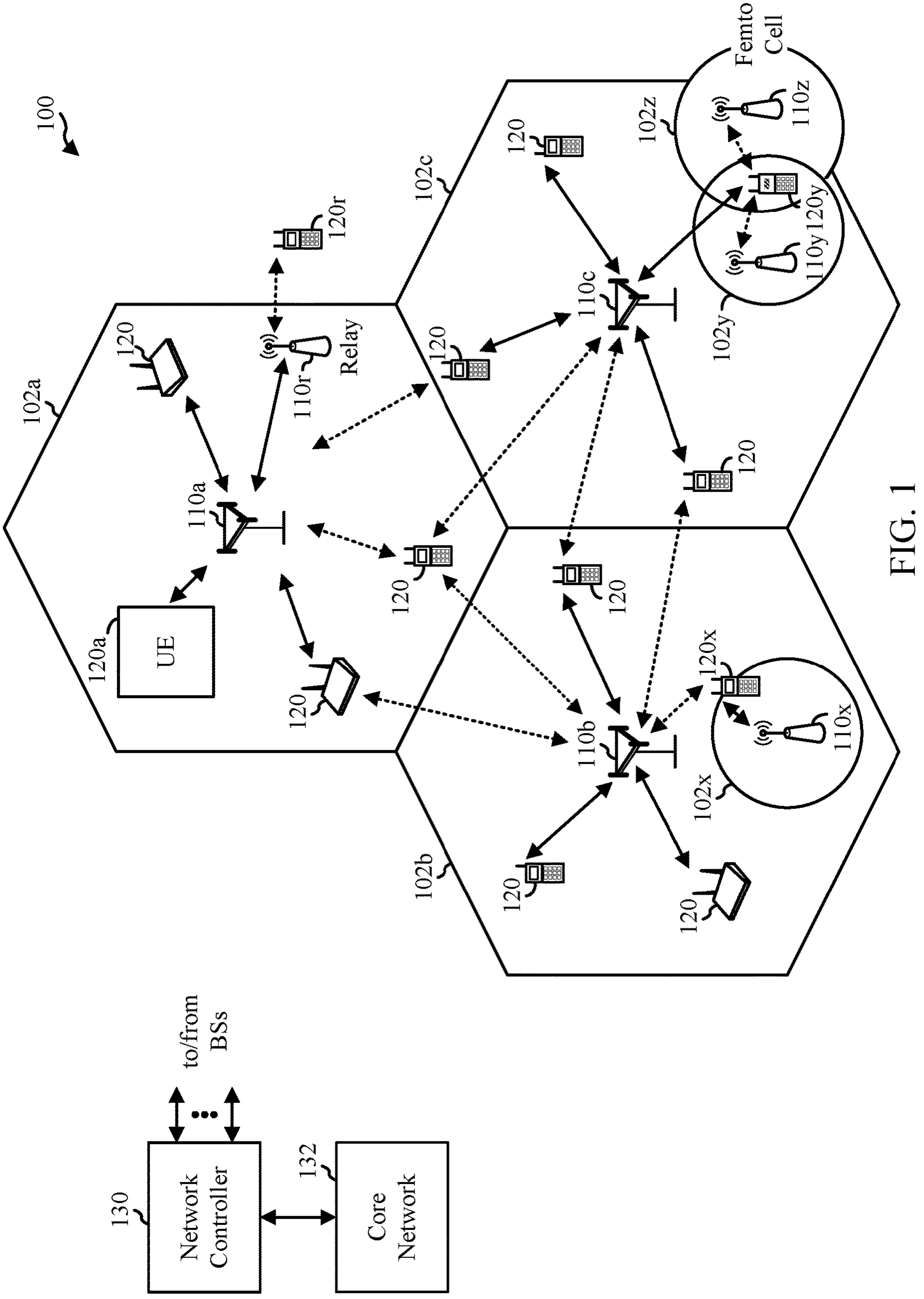
FIG. 1 is a diagram of an example wireless communications network, in which aspects of the present disclosure may be practiced.

Certain aspects of the present disclosure are directed towards a transmitter designed for lower current and area consumption while maintaining performance across process/temperature/supply variations. The transmitter may be designed to support a wide frequency range and share at least one transmit chain for different operating modes (e.g., 2.4 GHz (2G) and 5 GHz (5G) operations for WiFi), although certain aspects of the present disclosure may applied to transmitters that are not shared across operating modes. Due to the low power and area consumption design of the transmitter, one or more components (e.g., digital-to-analog converter (DAC), baseband filter (BBF), and/or passive mixer) of the transmit chain may not be able to drive a driver amplifier (DA) to operate at output power levels to facilitate operating at higher frequencies. Certain aspects of the present disclosure are directed towards using an inverter buffer (e.g., coupled to an output of the passive mixer) to supply sufficient power to the one or more PAs, facilitating support for higher frequencies with a lower power and area consumption design.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word “exemplary” is used herein to mean “serving as an example, instance, or illustration.” Any aspect described herein as “exemplary” is not necessarily to be construed as preferred or advantageous over other aspects.

As used herein, the term “connected with” in the various tenses of the verb “connect” may mean that element A is directly connected to element B or that other elements may be connected between elements A and B (i.e., that element A is indirectly connected with element B). In the case of electrical components, the term “connected with” may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as “BS 110” or collectively as “BSs 110”) and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a “cell,” which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipments (UEs) 120*a-y* (each also individually referred to herein as “UE 120” or collectively as “UEs 120”) in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a “transmitting entity” is an independently operated apparatus or device capable of transmitting data via a frequency channel, and a “receiving entity” is an independently operated apparatus or device capable of receiving data via a frequency channel. In the following description, the subscript “dn” denotes the downlink, the subscript “up” denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include a transceiver implemented with an inverter buffer, as described in more detail herein.

Figure 2:
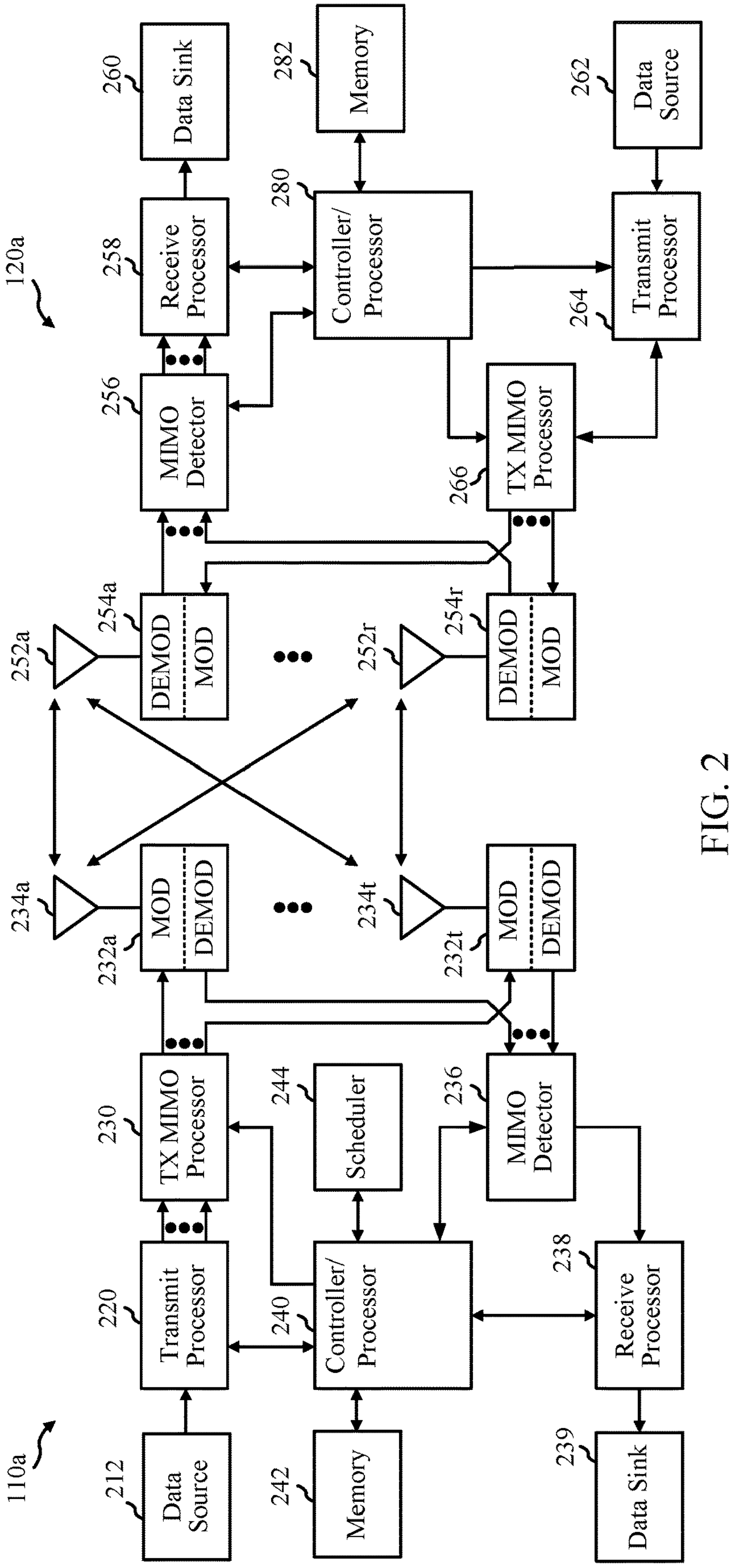
FIG. 2 is a block diagram conceptually illustrating a design of an example base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc. to obtain an output sample stream. In some implementations, non-OFDM modulation schemes may be used to provide reduced power consumption. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

In certain aspects of the present disclosure, the transceivers 232 and/or the transceivers 254 may be implemented with an inverter buffer, as described in more detail herein.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
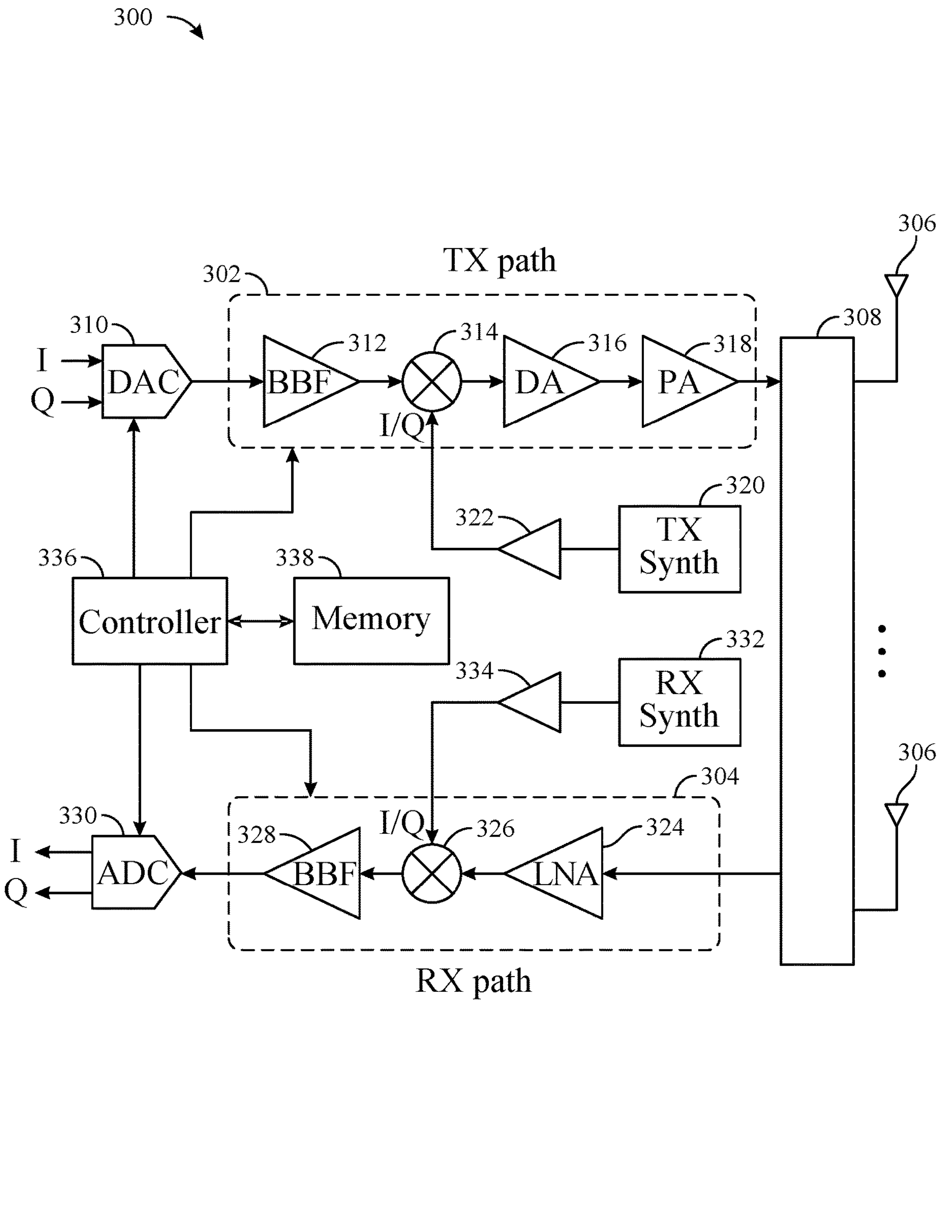
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission. In some aspects, an inverter buffer may be used to drive with sufficient linearity (e.g., to meet linearity specifications) the DA 316, as described in more detail herein.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for any of various other suitable systems.

Example Transmit Chain with Self-Biased Inverter Buffer

Certain aspects of the present disclosure provide a transmitter that shares in-phase and quadrature (I/Q) digital-to-analog converters (DACs) and transmit baseband (TXBB) filters for 2.4 GHz (2G) and 5 GHz (5G) implementations. The DACs and filters may be coupled to an up-converter (UPC) (e.g., a passive mixer) for up-conversion to facilitate transmission. The transmitter may be implemented for internet of things (IoT) devices and/or wearable devices (e.g., earphones), and thus, may have stringent power consumption and area consumption specifications. The DACs, filters, and UPC may be implemented in a manner as to consume low power and area.

When in a 2G operating mode, the signal from the UPC may be able to drive with sufficient linearity the driver amplifier (DA) of the transmitter. However, when in a 5G operating mode (e.g., operating at high frequencies such as the band for 5G, which may be as high as 6.4 GHz in some implementations), the signal from the UPC may be unable to drive with sufficient linearity the DA for transmission. Designing the DACs, filters, and UPC to be capable of driving with sufficient linearity the DA in 5G mode may result in increased power and area, making it challenging to meet the stringent power and area specifications for IoT applications while maintaining system specs. Certain aspects of the present disclosure are directed towards using a self-biased inverter buffer with a variable capacitive element and an inductive element in the transmit path, allowing for the transmit path to power the DA for transmission when operating in 5G mode with sufficient linearity.

Figure 4:
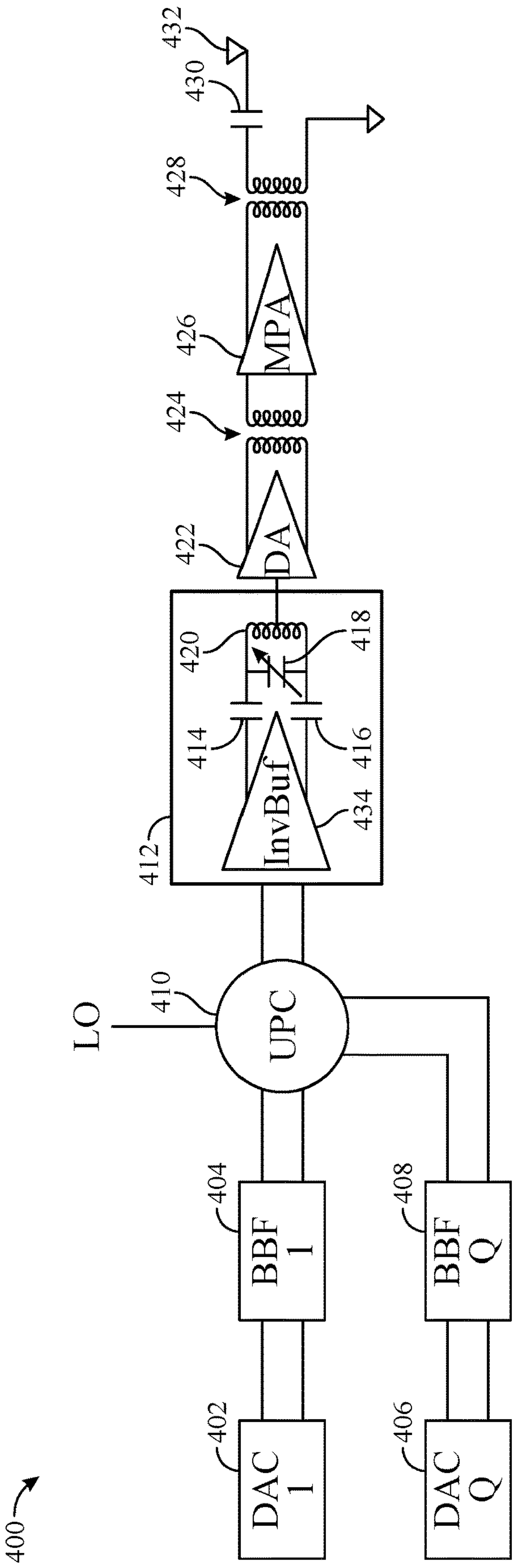
FIG. 4 illustrates an example transmitter, in accordance with certain aspects of the present disclosure.

FIG. 4 illustrates an example transmitter 400, in accordance with certain aspects of the present disclosure. Transmitter 400 includes an in-phase (I) DAC 402 and a quadrature (Q) DAC 406, which receive respective I and Q signals for conversion from the digital domain to the analog domain. The I and Q analog signals are provided to respective I and Q BBFs 404, 408 for filtering. A UPC 410 may be coupled to outputs of the BBFs 404, 408 for up-conversion of the filtered signals using a local oscillator (LO) signal. As shown, the up-converted signal from the UPC 410 may be provided to buffering circuitry 412 (e.g., including a self-biased inverter buffer 434) where an output of the buffering circuitry 412 is provided to one or more PAs for amplification of a signal for transmission via antenna 432.

In some aspects, a driver amplifier (DA) (also referred to as a pre-PA (PPA), which may correspond to DA 316 of FIG. 3) and a main PA (MPA) (e.g., corresponding to PA 318 of FIG. 3) may be used. For instance, the output of the buffering circuitry 412 may be received at an input of the DA 422 (e.g., the buffered signal from the buffering circuitry 412 may be provided to a gate of a transconductance transistor of the DA 422). The differential output of the DA 422 may be provided to a primary winding of a transformer 424, where the secondary winding of the transformer 424 is coupled to an input of an MPA 426. The signal from the secondary winding of the transformer 424 may be provided to the MPA 426 for amplification. The amplified signal from the MPA 426 is provided to a primary winding of a transformer 428 (e.g., a balanced-unbalanced (balun)). For example, the differential outputs of the MPA 426 may be coupled to respective terminals of the primary winding of the transformer 428. A terminal of the secondary winding of the transformer 428 may be coupled to a reference potential node (e.g., electrical ground), and another terminal of the transformer 428 may be coupled to antenna 432 through an alternating-current (AC) coupling capacitive element 430, as shown.

As shown, the buffering circuitry 412 may be include a self-biased inverter buffer 434 having differential outputs (e.g., providing different voltages Vop and Von) coupled to respective terminals of an inductive element 420 through respective AC-coupling capacitive elements 414, 416. In some aspects, a capacitive element 418 (e.g., a variable capacitive element) may be coupled between the terminals of the inductive element 420. The capacitive element 418 and the inductive element 420 may be used to expand the loading effect on the inverter buffer 434. For example, with the inductive element 420 and tuning of the capacitive element 418, the bandwidth associated with the inverter buffer 434 is expanded (e.g., providing a widened bandwidth centered at the frequency (e.g., 5.5 GHZ) of the LO) so that the bandwidth supports the transmit band (e.g., 4.9 GHz to 6.4 GHz) for the 5G mode. The mid-point (e.g., tap) of the inductive element may also serve to set the direct-current (DC) bias for the DA 422. That is, a bias voltage (Vbias) may be generated at the tap of the inductive element 420 to bias the DA 422.

Figure 5:
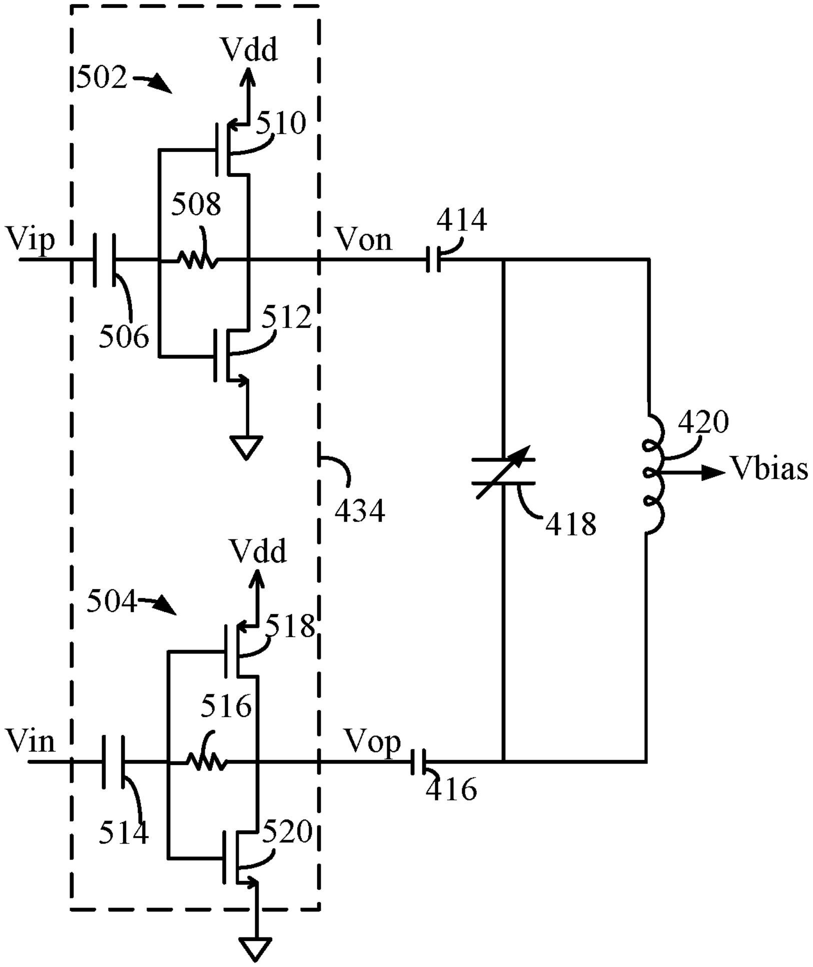
FIG. 5 illustrates example circuitry for implementing an inverter buffer, in accordance with certain aspects of the present disclosure.

FIG. 5 illustrates example circuitry for implementing an inverter buffer, such as the inverter buffer 434 of FIG. 4, in accordance with certain aspects of the present disclosure. As shown, the inverter buffer 434 may include an inverter 502 receiving a positive input voltage (Vip) through a capacitive element 506 (e.g., an AC-coupling capacitive element) and an inverter 504 receiving a negative input voltage (Vin) through a capacitive element 514. Vip and Vin may be received at Vip and Vin nodes of the inverter buffer, respectively, from the UPC 410 of FIG. 4.

The inverter 502 may include a p-type metal-oxide-semiconductor (PMOS) transistor 510 and an n-type metal-oxide-semiconductor (NMOS) transistor 512 having drains coupled to a negative output voltage (Von) node of the inverter buffer. The source of transistor 510 may be coupled to a voltage rail (Vdd), and a source of the transistor 512 may be coupled to a reference potential node (e.g., electric ground). The gates of the transistors 510, 512 may be coupled together and to a first terminal of the capacitive element 506 where a second terminal of the capacitive element 506 is coupled to the Vip node. In some aspects, a resistive element 508 may be coupled between the Von node and gates of the transistors 510, 512, biasing the inverter 502 (e.g., providing self-biasing for the inverter 502) with a certain gain. Similarly, inverter 504 may include a PMOS transistor 518 and an NMOS transistor 520 having drains coupled to a positive output voltage (Vop) node of the inverter buffer. The gates of the transistors 518, 520 may be coupled together and to a first terminal of the capacitive element 514 where a second terminal of the capacitive element 514 is coupled to the Vin node. In some aspects, a resistive element 516 may be coupled between the Vop node and gates of the transistors 518, 520, biasing the inverter 504 with a certain gain.

Figure 6:
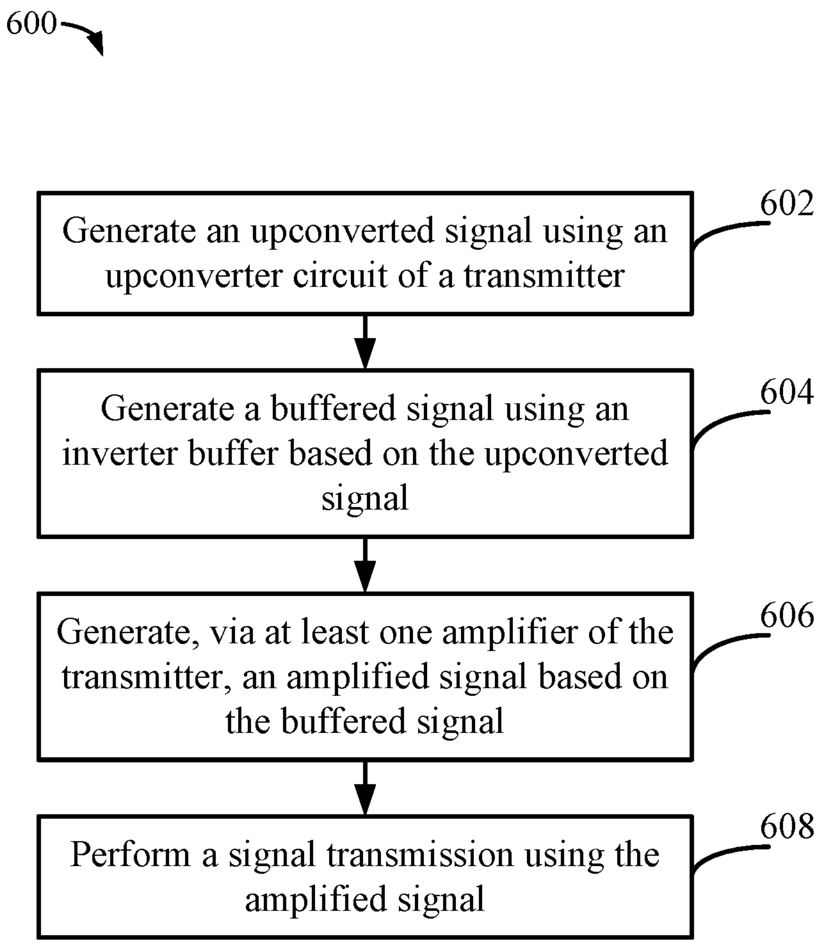
FIG. 6 is a flow diagram illustrating example operations for wireless communication, in accordance with certain aspects of the present disclosure.

FIG. 6 is a flow diagram illustrating example operations 600 for wireless communication, in accordance with certain aspects of the present disclosure. The operations 600 may be performed, for example, by a transmitter, such as the transmitter 400 of FIG. 4.

At block 602, the transmitter generates an upconverted signal using an upconverter circuit (e.g., UPC 410 of FIG. 4) of the transmitter. At block 604, the transmitter generates a buffered signal using an inverter buffer (e.g., inverter buffer 434) based on the upconverted signal. At block 606, the transmitter generates, via at least one amplifier (e.g., DA 422 and/or MPA 426) of the transmitter, an amplified signal based on the buffered signal. At block 608, the transmitter performs a signal transmission using the amplified signal. In some aspects, a maximum output power capability of the upconverter circuit is less than a power consumption of the at least one amplifier for transmission using a first frequency band. The transmitter may support the first frequency band (e.g., a band for 5G) and a second frequency band (e.g., a band for 2G) having a center frequency less than the center frequency of the first frequency band.

In some aspects, a first terminal of an inductive element (e.g., inductive element 420) is coupled to a first output of the inverter buffer. A tap of the inductive element may be coupled to an input of the at least one amplifier. The inductive element may include a second terminal coupled to a second output of the inverter buffer. The transmitter may set a capacitance of a capacitive element (e.g., capacitive element 418) to tune a bandwidth of the inverter buffer. The capacitive element may be coupled between the first terminal and the second terminal of the inductive element.

In some aspects, the inverter buffer may include a first transistor (e.g., transistor 510 of FIG. 5) with a source coupled to a voltage rail (e.g., Vdd) and a drain coupled to an output of the inverter buffer and a second transistor (e.g., transistor 512 of FIG. 5) with a source coupled to a reference potential node and a drain coupled to the output of the inverter buffer. A resistive element (e.g., resistive element 508) may be coupled between the output of the inverter buffer and gates of the first transistor and the second transistor. The resistive element may provide DC bias for the inverter buffer.

In some aspects, the amplified signal may be generated via a first amplifier (e.g., DA 422) of the at least one amplifier. The transmitter may generate another amplified signal using a second amplifier (e.g., MPA 426) of the at least one amplifier based on the amplified signal. The signal transmission may be performed using the other amplified signal.

EXAMPLE ASPECTS

In addition to the various aspects described above, specific combinations of aspects are within the scope of the present disclosure, some of which are detailed below:

Aspect 1: A transmitter, comprising: an upconverter circuit including one or more inputs coupled to one or more transmit chains of the transmitter; an inverter buffer including an input coupled to a first output of the upconverter circuit; and at least one amplifier coupled to a first output of the inverter buffer.

Aspect 2: The transmitter of Aspect 1, wherein a maximum output power capability of the upconverter circuit is less than a power consumption of the at least one amplifier for transmission using a first frequency band.

Aspect 3: The transmitter of Aspect 2, wherein the transmitter is configured to support the first frequency band and a second frequency band having a lower center frequency than the first frequency band.

Aspect 4: The transmitter according to any of Aspects 1-3, wherein the inverter buffer comprises a resistive element coupled between the input of the inverter buffer and the first output of the inverter buffer.

Aspect 5: The transmitter according to any of Aspects 1-4, further comprising an inductive element with a first terminal coupled to the first output of the inverter buffer and a tap coupled to an input of the at least one amplifier.

Aspect 6: The transmitter of Aspect 5, wherein: the inductive element includes a second terminal coupled to a second output of the inverter buffer; and the transmitter further comprises a capacitive element coupled between the first terminal and the second terminal of the inductive element.

Aspect 7: The transmitter of Aspect 6, wherein the capacitive element comprises a variable capacitive element.

Aspect 8: The transmitter according to any of Aspects 5-7, further comprising an alternating-current (AC)-coupling capacitive element coupled between the first output of the inverter buffer and the first terminal of the inductive element.

Aspect 9: The transmitter according to any of Aspects 1-8, wherein the inverter buffer comprises: a first transistor with a source coupled to a voltage rail and a drain coupled to the first output of the inverter buffer; a second transistor with a source coupled to a reference potential node and a drain coupled to the first output of the inverter buffer; and a resistive element coupled between the first output of the inverter buffer and gates of the first transistor and the second transistor.

Aspect 10: The transmitter of Aspect 9, wherein the inverter buffer further comprises an AC-coupling capacitive element coupled between the first output of the upconverter circuit and the gates of the first transistor and the second transistor.

Aspect 11: The transmitter according to any of Aspects 1-10, wherein the upconverter circuit comprises a passive mixer.

Aspect 12: The transmitter according to any of Aspects 1-11, wherein the at least one amplifier comprises: a first amplifier including an input coupled to a first output of the inverter buffer; a transformer including a primary winding coupled to an output of the first amplifier; a second amplifier including an input coupled to a secondary winding of the transformer; and another transformer including a primary winding coupled to an output of the second amplifier.

Aspect 13: The transmitter according to any of Aspects 1-12, wherein the one or more transmit chains comprise a first transmit chain for an in-phase (I) signal and a second transmit chain for a quadrature (Q) signal.

Aspect 14: The transmitter according to any of Aspects 1-13, wherein each of the one or more transmit chains comprises a digital-to-analog converter (DAC) and a baseband filter.

Aspect 15: A method for wireless communication, comprising: generating an upconverted signal using an upconverter circuit of a transmitter; generating a buffered signal using an inverter buffer based on the upconverted signal; generating, via at least one amplifier of the transmitter, an amplified signal based on the buffered signal; and performing a signal transmission using the amplified signal.

Aspect 16: The method of Aspect 15, wherein a maximum output power capability of the upconverter circuit is less than a power consumption of the at least one amplifier for transmission using a first frequency band.

Aspect 17: The method of Aspect 16, wherein the transmitter supports the first frequency band and a second frequency band having a lower center frequency than the first frequency band.

Aspect 18: The method according to any of Aspects 15-17, wherein a first terminal of an inductive element is coupled to a first output of the inverter buffer, and wherein a tap of the inductive element is coupled to an input of the at least one amplifier.

Aspect 19: The method of Aspect 18, wherein: the inductive element includes a second terminal coupled to a second output of the inverter buffer; and the method further comprises setting a capacitance of a capacitive element to tune a bandwidth of the inverter buffer, the capacitive element being coupled between the first terminal and the second terminal of the inductive element.

Aspect 20: The method according to any of Aspects 15-19, wherein the inverter buffer comprises: a first transistor with a source coupled to a voltage rail and a drain coupled to an output of the inverter buffer; a second transistor with a source coupled to a reference potential node and a drain coupled to the output of the inverter buffer; and a resistive element coupled between the output of the inverter buffer and gates of the first transistor and the second transistor.

Aspect 21: The method according to any of Aspects 15-20, wherein: the amplified signal is generated via a first amplifier of the at least one amplifier; the method further comprises generating another amplified signal using a second amplifier of the at least one amplifier based on the amplified signal; and the signal transmission is performed using the other amplified signal.

Aspect 22: A wireless device, comprising: an antenna; and a transmitter coupled to the antenna and comprising: an upconverter circuit including one or more inputs coupled to one or more transmit chains of the transmitter; an inverter buffer including an input coupled to a first output of the upconverter circuit; and a first amplifier coupled to a first output of the inverter buffer and including an output coupled to the antenna.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A transmitter, comprising:

an upconverter circuit including one or more inputs coupled to one or more transmit chains of the transmitter;

an inverter buffer including an input coupled to a first output of the upconverter circuit; and at least one amplifier coupled to a first output of the inverter buffer.

2. The transmitter of claim 1, wherein a maximum output power capability of the upconverter circuit is less than a power consumption of the at least one amplifier for transmission using a first frequency band.

3. The transmitter of claim 2, wherein the transmitter is configured to support the first frequency band and a second frequency band having a lower center frequency than the first frequency band.

4. The transmitter of claim 1, wherein the inverter buffer comprises a resistive element coupled between the input of the inverter buffer and the first output of the inverter buffer.

5. The transmitter of claim 1, further comprising an inductive element with a first terminal coupled to the first output of the inverter buffer and a tap coupled to an input of the at least one amplifier.

6. The transmitter of claim 5, wherein:

the inductive element includes a second terminal coupled to a second output of the inverter buffer; and the transmitter further comprises a capacitive element coupled between the first terminal and the second terminal of the inductive element.

7. The transmitter of claim 6, wherein the capacitive element comprises a variable capacitive element.

8. The transmitter of claim 5, further comprising an alternating-current (AC)-coupling capacitive element coupled between the first output of the inverter buffer and the first terminal of the inductive element.

9. The transmitter of claim 1, wherein the inverter buffer comprises:

a first transistor with a source coupled to a voltage rail and a drain coupled to the first output of the inverter buffer;

a second transistor with a source coupled to a reference potential node and a drain coupled to the first output of the inverter buffer; and a resistive element coupled between the first output of the inverter buffer and gates of the first transistor and the second transistor.

10. The transmitter of claim 9, wherein the inverter buffer further comprises an AC-coupling capacitive element coupled between the first output of the upconverter circuit and the gates of the first transistor and the second transistor.

11. The transmitter of claim 1, wherein the upconverter circuit comprises a passive mixer.

12. The transmitter of claim 1, wherein the at least one amplifier comprises:

a first amplifier including an input coupled to a first output of the inverter buffer;

a transformer including a primary winding coupled to an output of the first amplifier;

a second amplifier including an input coupled to a secondary winding of the transformer; and another transformer including a primary winding coupled to an output of the second amplifier.

13. The transmitter of claim 1, wherein the one or more transmit chains comprise a first transmit chain for an in-phase (I) signal and a second transmit chain for a quadrature (Q) signal.

14. The transmitter of claim 1, wherein each of the one or more transmit chains comprises a digital-to-analog converter (DAC) and a baseband filter.

15. A method for wireless communication, comprising:

generating an upconverted signal using an upconverter circuit of a transmitter;

generating a buffered signal using an inverter buffer based on the upconverted signal;

generating, via at least one amplifier of the transmitter, an amplified signal based on the buffered signal; and performing a signal transmission using the amplified signal.

16. The method of claim 15, wherein a maximum output power capability of the upconverter circuit is less than a power consumption of the at least one amplifier for transmission using a first frequency band.

17. The method of claim 16, wherein the transmitter supports the first frequency band and a second frequency band having a lower center frequency than the first frequency band.

18. The method of claim 15, wherein a first terminal of an inductive element is coupled to a first output of the inverter buffer, and wherein a tap of the inductive element is coupled to an input of the at least one amplifier.

19. The method of claim 18, wherein:

the inductive element includes a second terminal coupled to a second output of the inverter buffer; and the method further comprises setting a capacitance of a capacitive element to tune a bandwidth of the inverter buffer, the capacitive element being coupled between the first terminal and the second terminal of the inductive element.

20. A wireless device, comprising:

an antenna; and a transmitter coupled to the antenna and comprising:

an upconverter circuit including one or more inputs coupled to one or more transmit chains of the transmitter;

an inverter buffer including an input coupled to a first output of the upconverter circuit; and a first amplifier coupled to a first output of the inverter buffer and including an output coupled to the antenna.

* * * * *